(12) United States Patent
Seidel et al.

(10) Patent No.: US 10,541,508 B2
(45) Date of Patent: Jan. 21, 2020

(54) DIODE LASER WITH HOUSING

(71) Applicant: JENOPTIK Optical Systems GmbH, Jena (DE)

(72) Inventors: Sebastian Seidel, Stadtroda (DE); Peter Schmidt, Weimar (DE); Petra Hennig, Moersdorf (DE); Alexander Leser, Neuengoenna (DE)

(73) Assignee: JENOPTIK Optical Systems GmbH, Jena (DE)

( * ) Notice: Subject to any disclaimer, the term of this patent is extended or adjusted under 35 U.S.C. 154(b) by 0 days.

(21) Appl. No.: 16/017,388

(22) Filed: Jun. 25, 2018

(65) Prior Publication Data

US 2018/0375285 A1  Dec. 27, 2018

(30) Foreign Application Priority Data

Jun. 23, 2017  (DE) ................. 10 2017 210 602
May 2, 2018   (DE) ................. 10 2018 110 529

(51) Int. Cl.
| | |
|---|---|
| *H01S 5/02* | (2006.01) |
| *H01S 5/40* | (2006.01) |
| *H01S 5/022* | (2006.01) |
| *H01S 5/024* | (2006.01) |
| *H01S 5/042* | (2006.01) |
| *H01S 5/34* | (2006.01) |

(52) U.S. Cl.
CPC ........ *H01S 5/0206* (2013.01); *H01S 5/02236* (2013.01); *H01S 5/4025* (2013.01); *H01S 5/02296* (2013.01); *H01S 5/02423* (2013.01); *H01S 5/042* (2013.01); *H01S 5/34* (2013.01)

(58) Field of Classification Search
CPC ............... H01S 5/0206; H01S 5/02236; H01S 5/02423; H01S 5/4025
USPC ......... 372/50.12, 34; 438/122; 361/782, 700
See application file for complete search history.

(56) References Cited

U.S. PATENT DOCUMENTS

| | | | |
|---|---|---|---|
| 4,825,081 A | 4/1989 | Wille et al. | |
| 5,764,675 A * | 6/1998 | Juhala ................ | H01S 5/02423 257/99 |
| 5,835,518 A | 11/1998 | Mundinger et al. | |
| 6,188,707 B1 | 2/2001 | Irwin et al. | |
| 6,295,307 B1 | 9/2001 | Hoden et al. | |
| 6,975,034 B2 * | 12/2005 | Hennig ............... | H01S 5/02423 257/762 |
| 7,801,190 B2 | 9/2010 | Lorenzen et al. | |
| 2004/0022502 A1 | 2/2004 | Zhou | |
| 2004/0082112 A1 * | 4/2004 | Stephens ............ | H01S 5/02248 438/122 |

(Continued)

FOREIGN PATENT DOCUMENTS

| | | |
|---|---|---|
| CN | 102324698 A | 1/2012 |
| DE | 10229712 A1 | 1/2004 |

(Continued)

*Primary Examiner* — Tuan N Nguyen
(74) *Attorney, Agent, or Firm* — Muncy, Geissler, Olds & Lowe, P.C.

(57) ABSTRACT

A diode laser comprising a plurality of laser bars. The laser bars are constructed as a laser stack with heat conducting bodies arranged between the bars. The laser bars are arranged in an interior of a housing. The housing is formed from a frame fitted on the multilayer substrate and a window. The empty volume is less than half of the total volume of the interior.

17 Claims, 7 Drawing Sheets

(56) References Cited

U.S. PATENT DOCUMENTS

| | | | | |
|---|---|---|---|---|
| 2005/0141575 A1* | 6/2005 | Lorenzen | ............ | H01S 5/02264 372/34 |
| 2008/0037602 A1* | 2/2008 | Thiagarajan | ........ | H01S 5/02276 372/36 |
| 2010/0040098 A1 | 2/2010 | Parent et al. | | |

FOREIGN PATENT DOCUMENTS

| | | |
|---|---|---|
| DE | 102009040834 A1 | 5/2011 |
| WO | WO2007082508 A1 | 7/2007 |

* cited by examiner

DIODE LASER WITH HOUSING

This nonprovisional application claims priority under 35 U.S.C. § 119(a) to German Patent Application Nos. 10 2017 210 602.6, which was filed in Germany on Jun. 23, 2017 and 10 2018 110 529.0, which was filed in Germany on May 2, 2018, and which are both herein incorporated by reference.

BACKGROUND OF THE INVENTION

Field of the Invention

The present invention relates to a laser radiation source having a high power density. Such laser radiation sources can be produced on the basis of stacked diode laser elements, in particular laser bars. The waste heat can be dissipated by heat conduction in a direction counter to the beam direction towards a multilayer substrate. Such laser radiation sources are offered commercially in particular for quasi-continuous operation (qcw). In addition, such radiation sources may also be suitable for continuous-wave operation (cw) or pulsed operation.

Description of the Background Art

A stack of laser bars is known from U.S. Pat. No. 4,825,081 A, for example. The open design has the effect that the laser bars can de damaged during handling or during operation. Similar laser radiation sources having the same disadvantages are also known for example from U.S. Pat. No. 6,295,307 B1, US 20080037602 A1, U.S. Pat. Nos. 6,188,707 and 5,835,518 A. WO 2007/082508 A1 discloses a laser radiation source in which, between two laser bars, two heat conducting bodies are arranged with a respective air gap therebetween. Contaminants can accumulate in the air gaps, likewise below the collimator lenses. The lifetime of the laser can be adversely affected as a result.

US 2010/0040098 A1 discloses a laser bar stack with an optical system holder. What is disadvantageous is that the laser facets can be contaminated during handling or during operation.

DE 102009040834 A1 discloses a laser in which a laser bar is provided with two heat conducting bodies. The front facet of the laser bar is sealed from the environment by a window. To that end, a seal is provided between the window and the heat conducting bodies.

In the prior art, a disadvantage is that a gap between the heat conducting bodies has to be separately sealed. Moreover, such an arrangement is very complex to produce if the laser has a plurality of laser bars.

DE 10229712 A1, which corresponds to U.S. Pat. No. 6,975,034, which is herein incorporated by reference, and which discloses a semiconductor module comprising a multilayer substrate, onto which a housing is placed. A large volume is present in the interior.

In the prior art, however, a disadvantage is that moisture situated in an interior can condense on the laser facets and the laser bars can incur damage as a result.

US20040022502A1 discloses a method of hermetically sealing a photonic component. A large empty volume in comparison with the component volume is present in the interior. A hermetic sealing of the housing with a metal layer is provided in order to protect the component against the ingress of moisture. That is complex. Moreover, included moisture can condense on the laser bars.

US 2004/0082112 A1 discloses a laser diode packaging method in which a laser comprising a plurality of laser bars is covered with a transparent sealing material. That has the disadvantage that the power density at the facets of the laser bars must be low enough that the sealing material does not burn away. The maximum achievable output power of the laser may be limited as a result.

CN 102324698 A discloses a diode laser comprising a light funnel. What is disadvantageous is that the laser bars do not have sufficient protection against damage and contamination.

U.S. Pat. No. 5,764,675 A discloses a laser in which a stack of laser bars is arranged in a housing with a window or a lens. Contact springs are used in that case to make contact with the laser bar stack. The high space requirement behind the laser bar stack is disadvantageous. As a result, a flat construction of the laser is not possible.

SUMMARY OF THE INVENTION

It is therefore an object of the present invention to provide a diode laser of high power density which permits handling and operation in a simple manner with minimal risk of damage.

The laser beam source according to the invention can be handled and operated with a minimal risk of damage. The laser bars are reliably protected against environmental influences, in particular against mechanical environmental influences, contamination, termites and moisture. Moreover, safety during operation of the laser beam source can be increased and erroneous use of the laser beam source can be prevented. Moreover, it is possible to avoid damage to the laser as a result of diffusing cooling water.

The diode laser according to an exemplary embodiment of the invention comprises a stack of diode laser elements. The diode laser elements can be beam sources configured as laser bars. A laser bar can be configured in a known manner as an edge emitting component and comprise one or preferably a plurality of emitters, which can be arranged in a manner offset with respect to one another in each case in a y-direction. A laser bar can preferably have a width of between 3 mm and 12 mm in the y-direction. A laser bar can comprise a plurality of emitters arranged offset with respect to one another in a direction y and each having a light exit facet. The emitters can emit a laser radiation in a main radiation direction z. A laser bar can preferably have between 3 and 100 emitters; laser bars having 5, 7, 19 or 49 emitters, in particular, are commercially available. The center-to-center distance between adjacent emitters can preferably be between 0.1 mm and 1 mm. The thickness of the laser bar can preferably be between 0.05 mm and 0.2 mm in an x-direction. The resonator length of the emitters of a laser bar in a z-direction can preferably be between 0.5 mm and 6 mm. The direction of the central rays of the emitted laser radiation can be the z-direction. The directions x, y and z can be at right angles to one another. The laser bar can have a known epitaxially produced layer sequence as a p-n junction with a quantum well. The individual emitters can be configured for example as broad stripe emitters or as ridge waveguides. A plurality of layer sequences each having at least one quantum well, i.e. a plurality of p-n junctions disposed electrically in series, can also be present. Such bars are also referred to a nanostack. A plurality of emitters are then stacked one above another in the x-direction.

A laser bar can be pumped by electric current. For current input, a first electrical contact pad and a second electrical contact pad can be provided at each laser bar.

The laser bars can be arranged in a manner offset with respect to one another in a direction x in a plurality of parallel xy-planes relative to the coordinate system mentioned above. The diode laser comprises a plurality of electrically conductive heat conducting bodies, i.e. at least two thereof. The heat conducting bodies can have in the x-direction an extent that is greater than or equal to the resonator length of the laser bars. By way of example, the heat conducting bodies can have a length in the z-direction that is 0.01 mm to 1 mm greater than the resonator length of the laser bars. An electrically conductive heat conducting body can be arranged between two respective laser bars. This can ensure that the two respective laser bars mentioned are electrically connected via the heat conducting body.

As an alternative, in each case two electrically conductive heat conducting bodies can be arranged between two respective laser bars, said heat conducting bodies being electrically connected to one another via a respective layer region of the first metallic layer. A respective gap can be provided between the two heat conducting bodies.

Alternatively, two or more laser bars can also be stacked one above another directly, i.e. without heat conducting bodies arranged therebetween.

The laser bars and heat conducting bodies can form a stack. The distance between adjacent bars, i.e. the distance in the x-direction, can be chosen for example advantageously between 0.5 mm and 5 mm. However, this distance can also be chosen to be smaller. In the case of bars stacked one directly above another, said distance corresponds to the bar thickness and can be approximately 0.1 mm and, for example. In the stack, the laser bars can be electrically connected in series. A first and a last heat conducting body can be arranged at the ends of the stack and be provided for the electrical contact of the stack. The first heat conducting body can be connected to a cathode contact. The cathode contact can be configured as a layer region of the first metallic layer. The last heat conducting body can be connected to an anode contact. The anode contact can be configured as a further layer region of the first metallic layer. The operating current of the laser bars can flow from the anode contact through the stack to the cathode contact. The electrical conductivity of the heat conducting bodies can be brought about by their being produced from a metallic material. Alternatively, the electrical conductivity can also be brought about by the heat conducting bodies being provided with an electrically conductive surface coating. They can then conduct the operating current even if they are formed of an electrically insulating basic material.

The diode laser can comprise at least one multilayer substrate. The layers can also be referred to a plies. Therefore, the synonymous term multi-ply substrate can also be used. The multilayer substrate can be configured as a carrier and make a significant contribution to the mechanical stability of the diode laser. Advantageously, the multilayer substrate can be configured in a planar fashion, for example in a plate-shaped fashion. It comprises a first electrically insulating layer. The first electrically insulating layer can be configured as a plate composed of a ceramic material. By way of example, the plate can be formed of $Al_2O_3$, AlN, BeO, SiC. Other materials such as plastic or diamond would furthermore be appropriate. A high thermal conductivity may be advantageous in order to be able to dissipate the waste heat from the stack. The thickness of the electrically insulating layer can advantageously be for example between 0.2 mm and 5 mm; by way of example, a standard thickness of 0.25 mm, 0.38 mm, 0.5 mm, 0.63 mm, 1 mm, 2 mm or 5 mm can be used. A mechanical stability of the carrier can be provided by a sufficiently thick electrically insulating layer. However, a thin electrically insulating layer can also be used. The thickness can be between 1 µm and 100 µm, for example. If a mechanical stability of the carrier is required, this stability can then be provided by a different layer, for example a second metallic layer.

The multilayer substrate furthermore comprises at least one first metallic layer. The first metallic layer can advantageously be for example a thin-film metallization having a layer thickness (extent in z-direction) of 0.1 µm to 20 µm, which can be applied to an electrically insulating layer configured as a ceramic plate. The first metallic layer can be produced by sputtering, for example. The firing of a metallization paste would also be possible. The first metallic layer can also advantageously be configured as a thick-film metallization having a thickness of 10 µm to 500 µm. A layer of this type can be produced for example by the known DCB method (direct copper bonding). A galvanic layer construction is also appropriate for producing the first metallic layer.

The multilayer substrate has a mounting surface. The mounting surface can lie in an xy-plane. the mounting surface can be determined by the stack and the frame being connected to this surface. The mounting surface can be the surface of the first metallic layer.

The first metallic layer can be subdivided into a plurality of layer regions. The objective of this subdivision is to avoid an electrical short circuit of the laser bars via the heat conducting bodies and the first metallic layer. In this case, a short circuit can be understood to mean that at least part, for example more than 1%, of the operating current fed in does not flow through a laser bar, but rather is conducted from one heat conducting body to another in some other way. The layer regions can be produced for example by firstly producing a continuous first metallic layer on the electrically insulating layer, for example by sputtering or the firing of a metallization paste. The first metallic layer can also firstly be produced as a continuous thick film for example by the DCB method. Thereafter the layer regions provided can be covered by an etching mask and separated from one another by an etching process. Alternatively, the layer regions can also be produced by selectively removing material of the first metallic layer for example by eroding using a laser beam or a grinding tool. Removing material can thus give rise to interruptions (gaps) between interruptions. Moreover, the layer regions can also be produced by selectively applying layer material, for example by screen printing of a metallization paste. The layer regions can also be produced by means of a mask, wherein the interruptions are covered by the mask during layer production. The layer regions can also be galvanically reinforced in order to increase the layer thickness. The layer regions can be defined by their not being interconnected among one another by material of the first metallic layer. In the mathematical sense, therefore, with regard to the layer material of the first metallic layer, non-contiguous regions can thus be involved. Advantageously, therefore, adjacent layer regions can be separated from one another by interruptions. An interruption can be determined by no metallic material of the first metallic layer being present at the respective location in the plane of the first metallic layer. A plurality of interruptions of the first metallic layer can be present in the region of the mounting surface. By way of example, a cathode contact and an anode contact can be formed as layer regions. The diode laser can thus advantageously have at least one anode contact and at least one cathode contact. An operating current introduced from outside can be conducted into the interior by means of the anode and cathode contacts in a yx-plane. The mounting surface, with the exception of the interruptions, can be a planar surface that can lie in an xy-plane. The mounting surface can be the surface of the first metallic layer.

The diode laser comprises a frame, which is connected to the mounting surface by means of an electrically insulating first joining medium. The electrically insulating first joining medium can be for example an adhesive, for example an acrylate, polyurethane or epoxy resin adhesive. Said adhesive can advantageously be filled with electrically insulating particles.

The diode laser comprises a window transparent to the laser radiation, said window being arranged at a distance from the light exit facets of the emitters and being connected to the frame by means of second joining medium. The distance between the window and the light exit facets can have the effect that the power density of the radiation upon impinging the window is reduced owing to the divergence of the laser radiation. A power density can be understood to mean the power per area. For this purpose, the distance $a_F$ between the light exit facets of the emitters and the window can advantageously be chosen to be greater than 0.05 mm. In order that the empty volume is kept small, the distance $a_F$ can advantageously be chosen to be less than 0.5 mm. Advantageously, the interfaces of the window can be provided with an antireflection coating. The window can be configured as a plane-parallel plate. The window can be embodied as a thin window, in order for example to maintain the beam quality of the laser bars. However, said window can also be configured as a thick plate. The plate thickness can be of a magnitude such that the divergent laser radiation of adjacent laser bars has an overlap upon emerging from the window. The laser radiation can be intermixed and homogenized in this way. The beam quality can be reduced as a result. That can mean that the radiation can no longer be focused or can be focused only to a restricted extent. An erroneous use of the diode laser can be avoided as a result. By way of example, laser radiation for a dermatological treatment can be generated by a diode laser according to the invention. The reduced focusability can contribute to avoiding damage that could otherwise be caused by laser radiation focused inadvertently or owing to improper use. By way of example, for this purpose, the window can advantageously have a thickness of at least 1 mm.

Alternatively, the window can also be configured as a lens array, for example as a cylindrical lens array. It can then be used for example for collimating the fast-axis divergence of the laser bars. That may be advantageous if collimated radiation is intended to be generated by the diode laser.

The diode laser has an interior delimited by the frame, the window and the first electrically insulating layer of the multilayer substrate. The inner surfaces of the components mentioned can be regarded as boundary surfaces. The interior has an interior volume $V_I$. The interior volume can be more than 10 mm$^3$ in a diode laser according to the invention. The heat conducting bodies and the laser bars are arranged in the interior. The interior likewise comprises a component volume $V_B$. The component volume should be understood to mean that proportion of the interior volume which is occupied by material in the solid state of matter. Material in the solid state of matter can be, in particular, the laser bars and the heat conducting bodies. Moreover, that part of the first metallic layer which is situated in the interior, excluding the interruptions, can be added. The component volume can thus be the sum of the volumes of the heat conducting bodies, the laser bars and the layer regions of the first metallic layer that are situated in the interior. Moreover, the diode laser can have an empty volume $V_L$. The empty volumetric proportion of the interior volume can be regarded as the empty volume. The empty volume can be filled with a gas or gas mixture or be present as vacuum. According to the invention, the component volume is more than 50% of the interior volume. To put it another way, the empty volume can be less than half of the interior volume. That can have a number of advantages. The structural size of the diode laser can be kept small. Moreover, owing to the small empty volume, only an extremely small amount of moisture in the form of water vapor may be present, too. The reliability and the lifetime can be improved as a result. Moreover, the frame and the window can be provided as optional components. As a result, it is possible to offer one type of the diode laser optionally in an embodiment with or in a second embodiment without window and frame. As a result, the manufacturing outlay is lower than if the embodiments were based on different types of diode lasers. Moreover, the securing of the diode laser of both embodiments can be made compatible.

Free surfaces that delimit the empty volume can be present in the interior. It may be advantageous if the ratio of the empty volume to the surface area of the free surfaces is less than 1 mm, particularly advantageously less than 0.3 mm, and especially advantageously less than 0.1 mm. Moisture (water vapor) possibly situated in the interior can then have a large potential condensation area. If condensation of the moisture occurs in the interior, formation of drops that is harmful to the laser bars can be reduced all the more effectively the smaller the ratio mentioned above.

The light exit facets can be arranged in an xy-plane. The window can advantageously be arranged parallel to said xy-plane. The mounting of the window can then be particularly simple. Moreover, a small part of the laser radiation reflected from the window can be coupled back into the light entrance facets of the laser bars. As a result, the spectrum of the laser radiation can be stabilized. In particular, to that end the window can be embodied as a narrowband reflector or as a Bragg grating. The window can likewise advantageously be arranged in a manner inclined with respect to said xy-plane by an angle β about the y-axis. That may be advantageous particularly if—for example in the case of broad stripe emitters—the feedback coupling mentioned above is intended to be avoided.

The interior can advantageously be hermetically sealed. That can be understood to mean that, apart from a technically dictated leakage rate, no gas exchange from the interior to the outside world can take place. Alternatively, it may also be advantageous not to hermetically seal the interior, but rather to permit gas exchange with the environment for example via a membrane incorporated in the frame. As a result, pressure equalization can be effected and moisture that penetrated into the interior can escape again toward the outside.

The diode laser can be cooled with a coolant, for example water. To that end, the multilayer substrate can have an inlet and an outlet for the coolant. Advantageously, inlet and outlet can be provided on that side of the multilayer substrate that faces away from the frame. As a result, it is possible to ensure that cooling water that diffuses out for example through sealing rings at the connections cannot reach the laser bars as water vapor.

The frame can have in a z-projection first edges having a first edge width $b_x$ in the x-direction and second edges having a second edge width $b_y$ in the y-direction. Advantageously, the first edge width $b_x$ can be less than the second edge width $b_y$. In that case the wide second edges can contribute to increasing the flexural stiffness of the multilayer substrate, while the narrow first edges only minimally restrict the space for securing the diode laser.

The first edges can be at a first distance $a_x$ from the heat conducting bodies and the second edges can be at a second distance $a_y$ from the heat conducting bodies. The distance $a_x$ can advantageously be less than the distance $a_y$. In that case, despite a production-dictated inner edge radius of the frame, the latter can be fitted such that space for securing the diode laser is only minimally restricted.

In the direction x alongside the frame at least one first cutout and in the direction −x alongside the frame at least one second cutout in the multilayer substrate can be provided. The first and second cutouts can be provided for attaching the diode laser by screwing and/or for making electrical contact with the diode laser. By way of example, the diode laser can be screwed onto a baseplate, wherein it is possible for the operating current to be fed in by means of contact shoes below the screw heads. Advantageously, a plurality of first and second cutouts, for example in each case two thereof, can be provided. The diode laser can then be secured using a plurality of screws, for example four thereof.

The frame can advantageously be produced from a plastic, a glass or a ceramic material. A short circuit between anode and cathode can then be avoided. The frame can likewise advantageously be produced from Ti, Al, Mg, Zn, some other metal or Si or comprise one or more of these substances.

The frame can be produced for example by conventional machining methods, for example milling. Owing to the dictates of production, the frame can have an inner edge rounding having an inner edge radius. Alternatively, it is possible to produce the frame by primary forming, for example injection molding, or by means of 3D printing. Primary forming or 3D printing methods may have the advantage that the inner edge radius can be chosen to be smaller than is possible in the case of machining methods. In order to enable a compact design despite an inner edge radius, the first and last heat conducting bodies can be provided with chamfers or roundings at the edges situated opposite the inner edge roundings of the frame.

The frame can advantageously have a superficial oxide or nitride layer. As a result, particularly in the case of a conductive frame material, an electrical insulation can be brought about. In the case of Al, an anodized layer can be provided.

A diode laser according to the invention can advantageously be used with a light funnel (light pipe, optical waveguide, concentrator), disposed downstream of the diode laser in the beam path, for uniformly illuminating a surface. A light funnel is described for example in CN102324698A, which is incorporated herein by reference. The light funnel has a light entrance side and a light exit side. The light funnel can be an optical waveguide having a cross section that tapers or widens or remains constant from the light entrance side to the light exit side. The cross section can taper along the z-direction with respect to its extent in the x-direction and/or y-direction. It can also widen along the z-direction with respect to its extent in the x-direction and/or y-direction. It can also be configured to remain constant along the z-direction with respect to its extent in the x-direction and/or y-direction. The cross section can advantageously be rectangular. The cross section can be understood to mean a section with the plane perpendicular to the direction z. The light funnel can have reflective side surfaces. The reflective side surfaces can reflect the laser beams. During reflection, the z-component of the beam direction of the laser beams can be reduced if the cross section tapers along the z-direction with respect to its extent in the x-direction and y-direction. As a result, the divergence of the laser radiation can be greater at the light exit side than at the light entrance side. The reflective side surfaces can advantageously be plane surfaces. By way of example four reflective surfaces can be present. The light funnel can be hollow. That means that no material is present between the light-reflecting surfaces. The hollow space can be configured in the shape of a truncated pyramid. However, it can also be configured as parallelpipedal. The reflective surfaces can be polished copper surfaces, for example. However, they can also be plastic or glass surfaces having a reflective metallic or dielectric coating. Alternatively, the light funnel can be configured as a glass body. The side surfaces thereof can have a reflective coating and/or can be provided for total internal reflection. In this case, the side surfaces can be outer surfaces of the glass body. The glass body can configured as a truncated pyramid having a rectangular base surface.

The use described in the preceding section can advantageously be incorporated in a handpiece of a medical device. A surface, for example a skin portion, can thus be illuminated uniformly with a strong light intensity. Devices of this type may be suitable for depilation, for example.

A diode laser according to the invention in a further advantageous embodiment can comprise a first laser arrangement and at least one further laser arrangement. It can comprise for example a first and exactly one further, namely a second, laser arrangement. However, it can also comprise even more further laser arrangements, for example a third and a fourth. The second, and each further laser arrangement can be constructed in the same way as the first. The first laser arrangement comprises a plurality of laser bars arranged in a manner offset with respect to one another in a direction x in parallel yz-planes, wherein each laser bar comprises a plurality of emitters arranged in a manner offset with respect to one another in a direction y and each having a light exit facet, which emit a laser radiation in a main radiation direction z. The first laser arrangement additionally comprises a plurality of heat conducting bodies. Each of the further laser arrangements, in particular the second laser arrangement, can comprise a plurality of laser bars arranged in a manner offset with respect to one another in a direction x in parallel yz-planes, wherein each laser bar comprises a plurality of emitters arranged in a manner offset with respect to one another in a direction y and each having a light exit facet, which emit a laser radiation in the main radiation direction z. All the light exit facets of all laser arrangements present can be arranged in one plane. Each of the further laser arrangements, in particular the second laser arrangement, can comprise a plurality of heat conducting bodies. The diode laser comprises a multilayer substrate, comprising at least one first electrically insulating layer and at least one first metallic layer, wherein the multilayer substrate has a mounting surface in an xy-plane. The diode laser additionally comprises a frame, which is connected to the mounting surface by means of an electrically insulating first joining medium, and a window transparent to the laser radiation, said window being arranged at a distance from the light exit facets of the emitters and being connected to the frame by means of a second joining medium. In this case, the at least one further laser arrangement can be arranged alongside the first laser arrangement in a manner offset in a direction x and/or a direction y. Advantageously, the second laser arrangement can be arranged parallel or antiparallel to the first laser arrangement. An offset arrangement can thus be understood here to mean in particular a parallel and an antiparallel arrangement. A parallel arrangement can be understood to mean that the first and second laser arrangements respectively have a first and second operating current direction and the first and second operating current directions are parallel, for example in the x-direction. An antiparallel arrangement can be understood to mean that the second operating current direction, for example in the −x-direction, is arranged antiparallel to the first operating current direction, for example in the x-direction. It is also possible for the first laser arrangement and the further laser arrangements to be arranged alongside one another respectively in a manner offset in a direction x and/or a direction y. The diode laser has an interior delimited by the frame, the window and the first electrically insulating layer of the multilayer substrate. The heat conducting bodies (6, 43) and the laser bars (2, 42) of all first and further laser arrangements can be arranged in the interior. The interior has an interior volume $V_I$ and additionally a component volume $V_B$. The component volume can be that proportion of the interior volume which is occupied by material in the solid state of matter. The component volume can be the sum of the volumes of the heat conducting bodies, the laser bars and the layer regions of the first metallic layer that are situated in the interior. Said volumes can be taken to include the volumes of the components of the first and all present further laser arrangements that are situated in the interior. The component volume is more than 50% of the interior volume.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
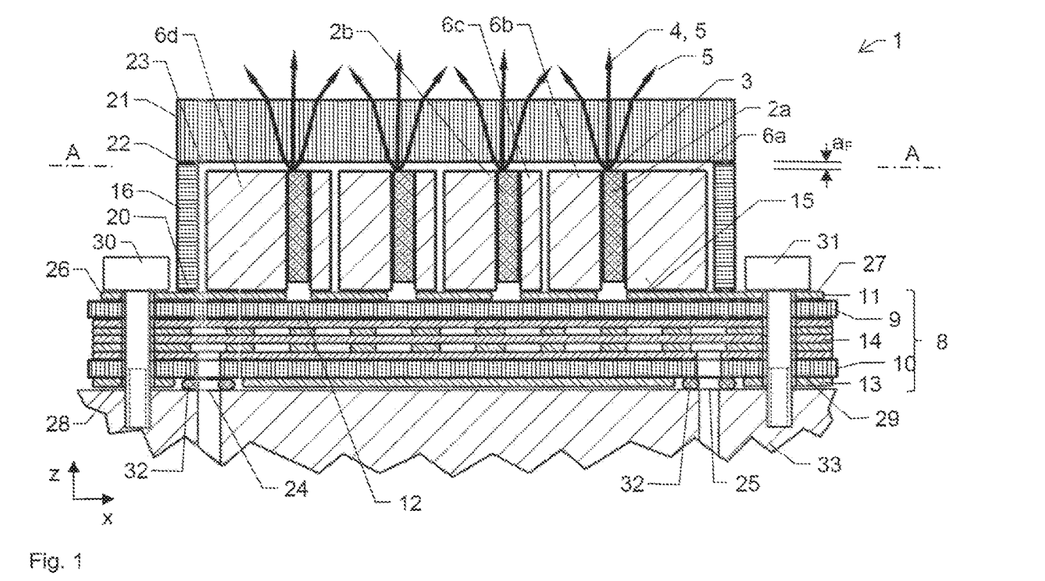
FIG. 1 shows an exemplary embodiment.

FIG. 1 shows an exemplary embodiment. A diode laser 1 according to the invention is illustrated in a sectional illustration BB, said diode laser being screwed onto a baseplate 33. The diode laser 1 comprises a plurality of laser bars 2 arranged in a manner offset with respect to one another in a direction x in parallel yz-planes. A first laser bar 2a and a second laser bar 2b are illustrated. Each laser bar 2 comprises a plurality of emitters arranged in a manner offset with respect to one another in a direction y and each having a light exit facet 3, which emit a laser radiation 5 in a main radiation direction z 4.

The diode laser 1 comprises a plurality of heat conducting bodies 6. A first heat conducting body 6a, a second heat conducting body 6b, a third heat conducting body 6c are illustrated. The heat conducting bodies and the laser bars are stacked in the direction x. The first heat conducting body 6a and a last heat conducting body 6d form the ends of the stack. In this exemplary embodiment, each laser bar is connected to two heat conducting bodies and each heat conducting body is connected to one bar. The first heat conducting body 6a is connected to a cathode contact 27. The last heat conducting body 6d is connected to an anode contact 26.

The diode laser 1 comprises a multilayer substrate 8. The multilayer substrate comprises a first electrically insulating layer 9, a second electrically insulating layer 10, a first metallic layer 11, a second metallic layer 13 and a cooler structure 14 situated between the first electrically insulating layer and the second electrically insulating layer. The cooler structure is provided for the throughflow of a coolant, for example water. The cooler structure comprises a plurality of layers. Coolers of this type are known for example from DE 10229712 A1, which corresponds to U.S. Pat. No. 6,975,034, and which is incorporated herein by reference. The multilayer substrate has a coolant inlet 24 and a coolant outlet 25. Seals 32 configured as O-rings are provided at the coolant inlet and at the coolant outlet. The sectional illustration additionally illustrates a first cutout 28 and a second cutout 29, and also a first screw 30 and a second screw 31. The latter serve for securing the diode laser on the baseplate. It is also possible for a plurality of first and second cutouts and a plurality of first and second screws to be present. Moreover, the screws bring about the required press-on force for the seals.

The first metallic layer is subdivided into a plurality of layer regions separated from one another by interruptions 12. The cathode contact 27 and the anode contact 26 are configured as layer regions.

The multilayer substrate 8 has a mounting surface 15 in an xy-plane. The diode laser 1 comprises a frame 16, which is connected to the mounting surface by means of an electrically insulating first joining medium 20.

The diode laser 1 comprises a window 21 transparent to the laser radiation, said window being arranged at a distance from the light exit facets 3 of the emitters and being connected to the frame by means of a second joining medium 22. The distance between the window and the light exit facets is designated by $a_F$. The refraction of the light in the window is illustrated by the bends of the laser beams 5 illustrated by way of example.

The diode laser has an interior 23 delimited by the frame 16, the window 21 and the first electrically insulating layer 9 of the multilayer substrate. The heat conducting body 6 and the laser bars 2 are arranged in the interior. The interior has an interior volume $V_I$. The interior additionally has a component volume $V_B$. The component volume is that proportion of the interior volume which is occupied by material in the solid state of matter. The component volume comprises the volumes of the laser bars, the heat conducting bodies and the layer regions of the first metallic layer that are situated within a z-projection of the hollow space of the frame. The interior likewise has an empty volume, which can be filled with a gas, for example dry air, nitrogen or argon. The component volume is more than 50% of the interior volume. The empty volume is less than 50% of the interior volume.

The position of a sectional plane AA is additionally indicated.

Figure 2:
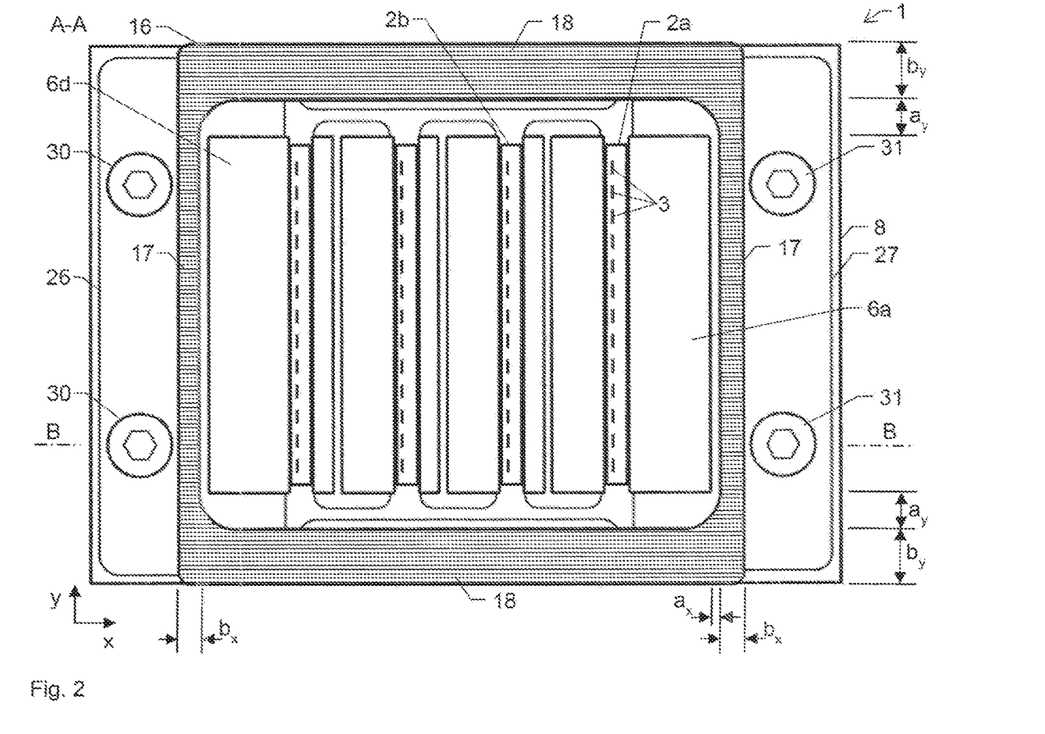
FIG. 2 shows the exemplary embodiment in a sectional illustration AA.

FIG. 2 shows the first exemplary embodiment in a sectional illustration AA. Each laser bar 2 comprises a plurality of emitters arranged in a manner offset with respect to one another in a direction y and each having a light exit facet 3. Moreover, it can be discerned that two first screws 30 and two second screws 31 for attaching the diode laser by screwing are provided here.

The frame has in a z-projection first edges 17 having a first edge width $b_x$ in the x-direction and second edges 18 having a second edge width $b_y$ in the y-direction. The first edge width $b_x$ is less than the second edge width $b_y$. As a result the screws can be arranged nearer to the first and last heat conducting bodies. Moreover, the second edge configured in a wide fashion sterilizes the diode laser against flexure.

The first edges 17 are at a first distance $a_x$ from the heat conducting bodies. The second edges 18 are at a second distance $a_y$ from the heat conducting bodies. The first distance $a_x$ is less than the second distance $a_y$.

Figure 3:
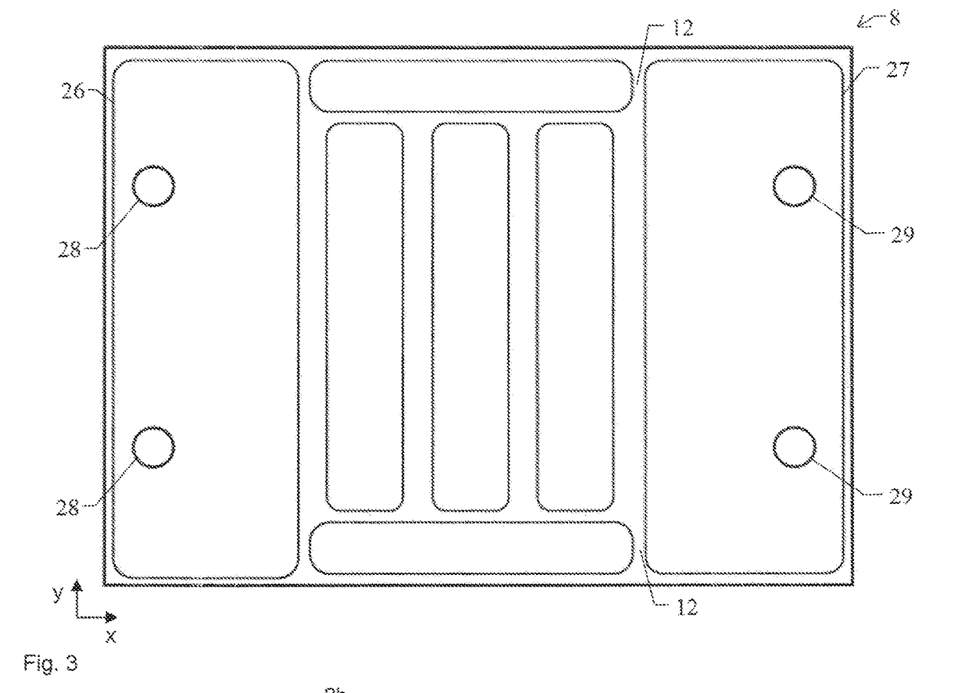
FIG. 3 shows the multilayer substrate of the exemplary embodiment.

FIG. 3 shows the multilayer substrate of the first exemplary embodiment. Two first cutouts 28 and two second cutouts 29 are present in the multilayer substrate. The layer regions of the first metallic layer are electrically isolated from one another by interruptions 12.

Figure 4:
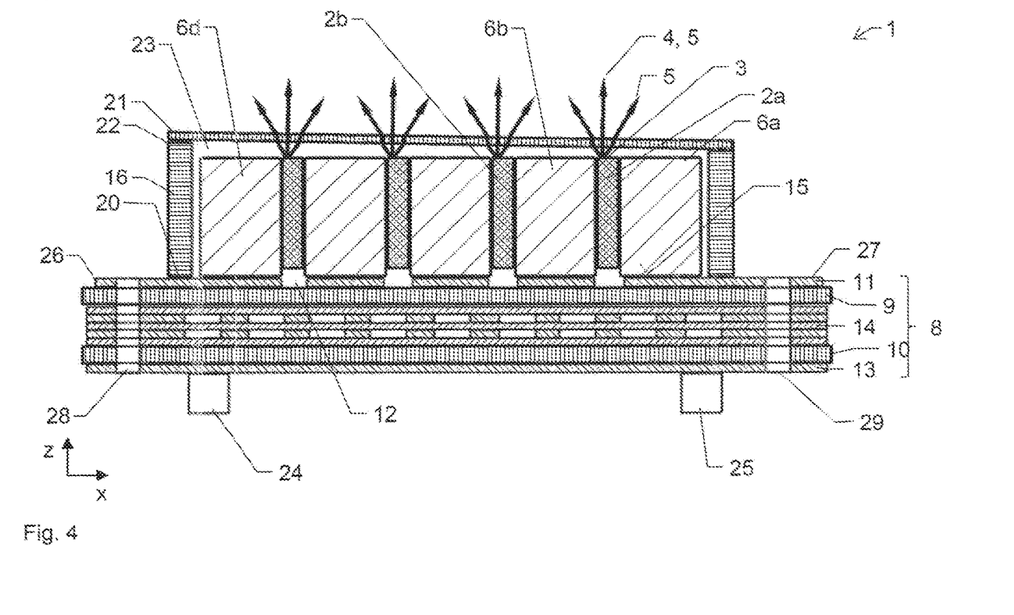
FIG. 4 shows an exemplary embodiment.

FIG. 4 shows a second exemplary embodiment. The diode laser 1 comprises a plurality of heat conducting bodies 6. The heat conducting bodies and the laser bars are stacked in the direction x. The first heat conducting body 6a and a last heat conducting body 6d form the ends of the stack. In this exemplary embodiment, each laser bar is connected to two heat conducting bodies, and each heat conducting body with the exception of the first and last heat conducting bodies, is connected to two laser bars.

The light exit facets are arranged in an xy-plane. The window 21 is arranged in a manner inclined with respect to said xy-plane by an angle β about the y-axis.

Figure 5:
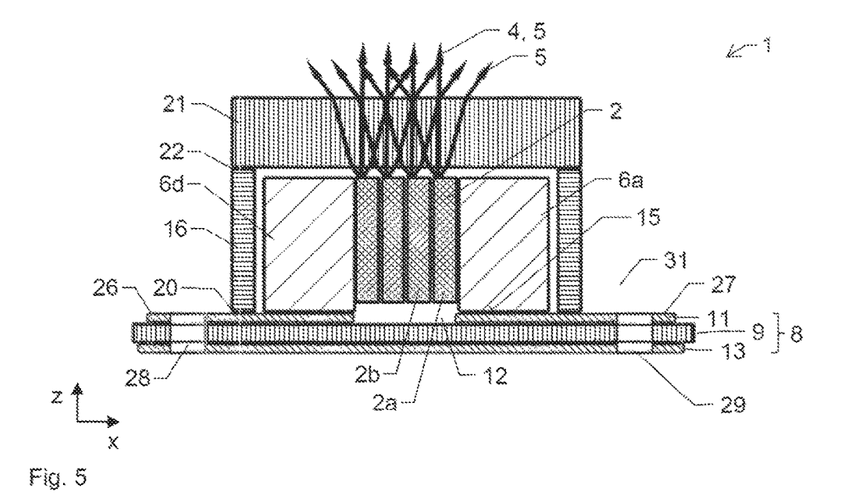
FIG. 5 shows an exemplary embodiment.

FIG. 5 shows a third exemplary embodiment. The diode laser 1 comprises two heat conducting bodies 6 and a plurality of laser bars 2. The heat conducting bodies and the laser bars are stacked in the direction x. The first heat conducting body 6a and the last heat conducting body 6d form the ends of the stack. In this exemplary embodiment, the laser bars are stacked without heat conducting bodies lying between two laser bars. The stack is terminated with the first and last heat conducting bodies. The laser radiation 5 of the individual bars is greatly superimposed here.

Figure 6:
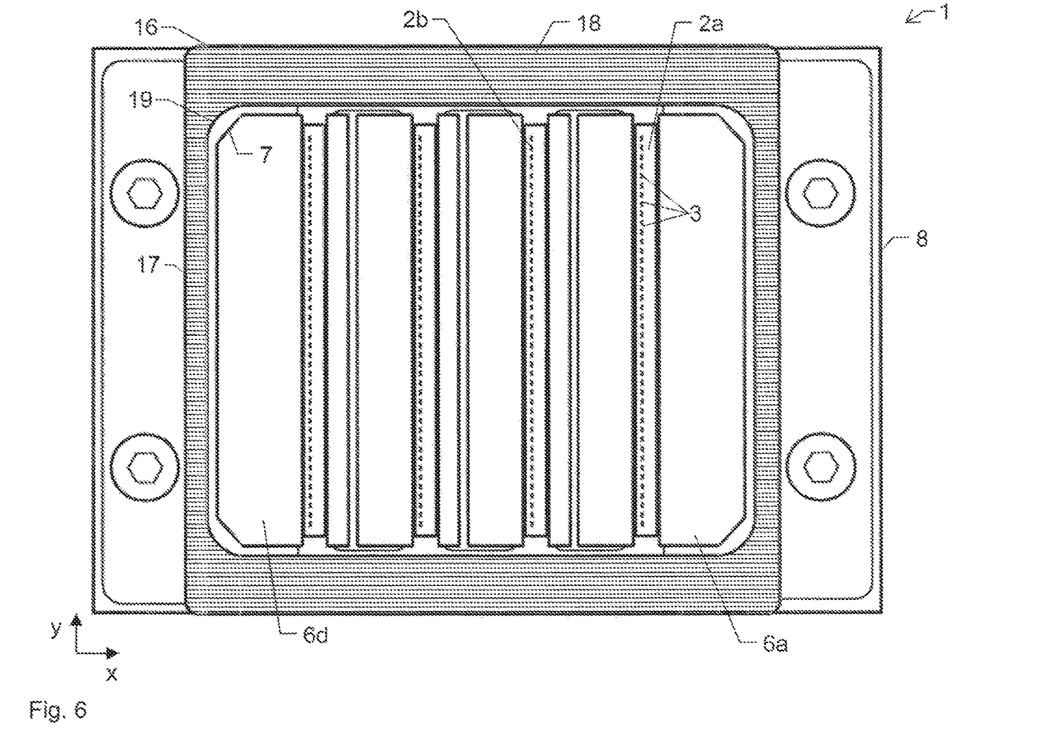
FIG. 6 shows am exemplary embodiment.

FIG. 6 shows a fourth exemplary embodiment. The frame 16 has inner edge roundings 19. In order to save structural space, chamfers or roundings 7 are provided on the first and last heat conducting bodies.

Figure 7:
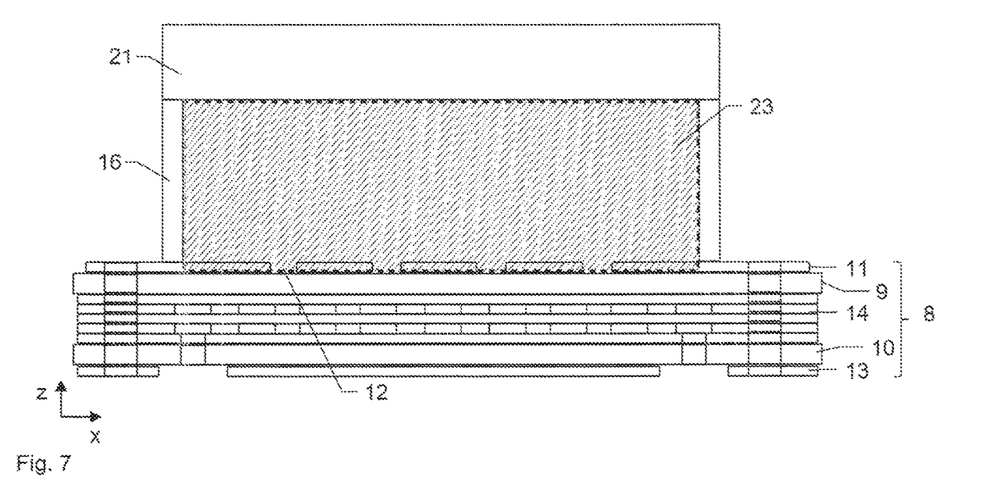
FIG. 7 illustrates the interior on the basis of the exemplary embodiment.

FIG. 7 illustrates the interior on the basis of the first exemplary embodiment. The interior 23 is understood to mean the hollow space formed by the frame, the window and the first electrically insulating layer. That part of the first metallic layer which is situated below the frame should be concomitantly added. As a result, the empty volume situated in the interruptions 12 is concomitantly taken into account.

Figure 8:
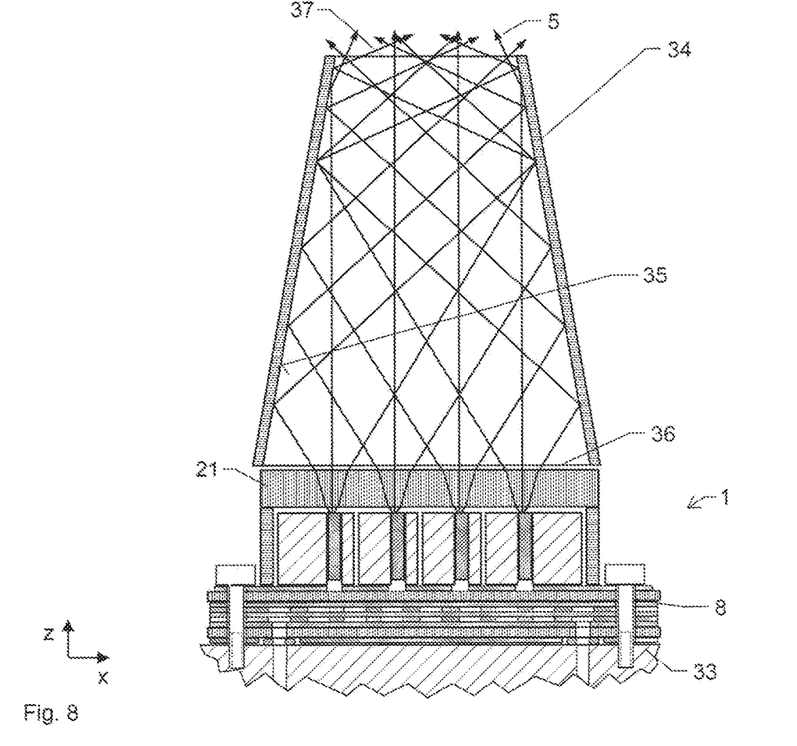
FIG. 8 shows a first use of the diode laser.
Figure 9:
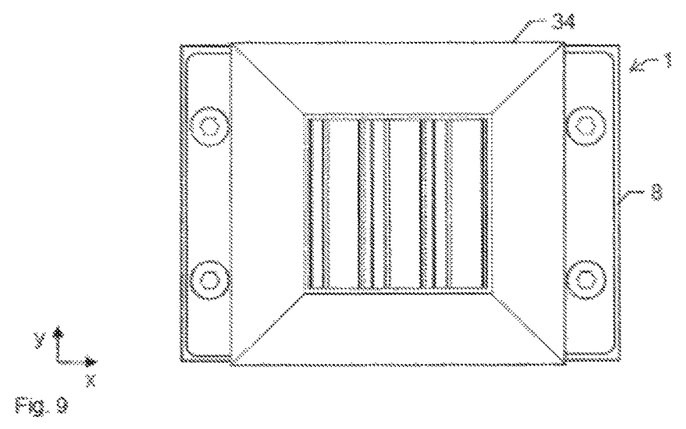
FIG. 9 shows the first use of the diode laser in the xy-view.

FIG. 8 shows a first use of the diode laser. FIG. 9 shows the first use of the diode laser in the xy-view. A light funnel 34 is disposed downstream of the diode laser 1 in the beam path. The light funnel has four plane reflective surfaces 35. It has a light entrance side 36 and a light exit side 37. The light emerging at the light exit side is homogeneous and can be used for uniformly illuminating a surface.

Figure 10:
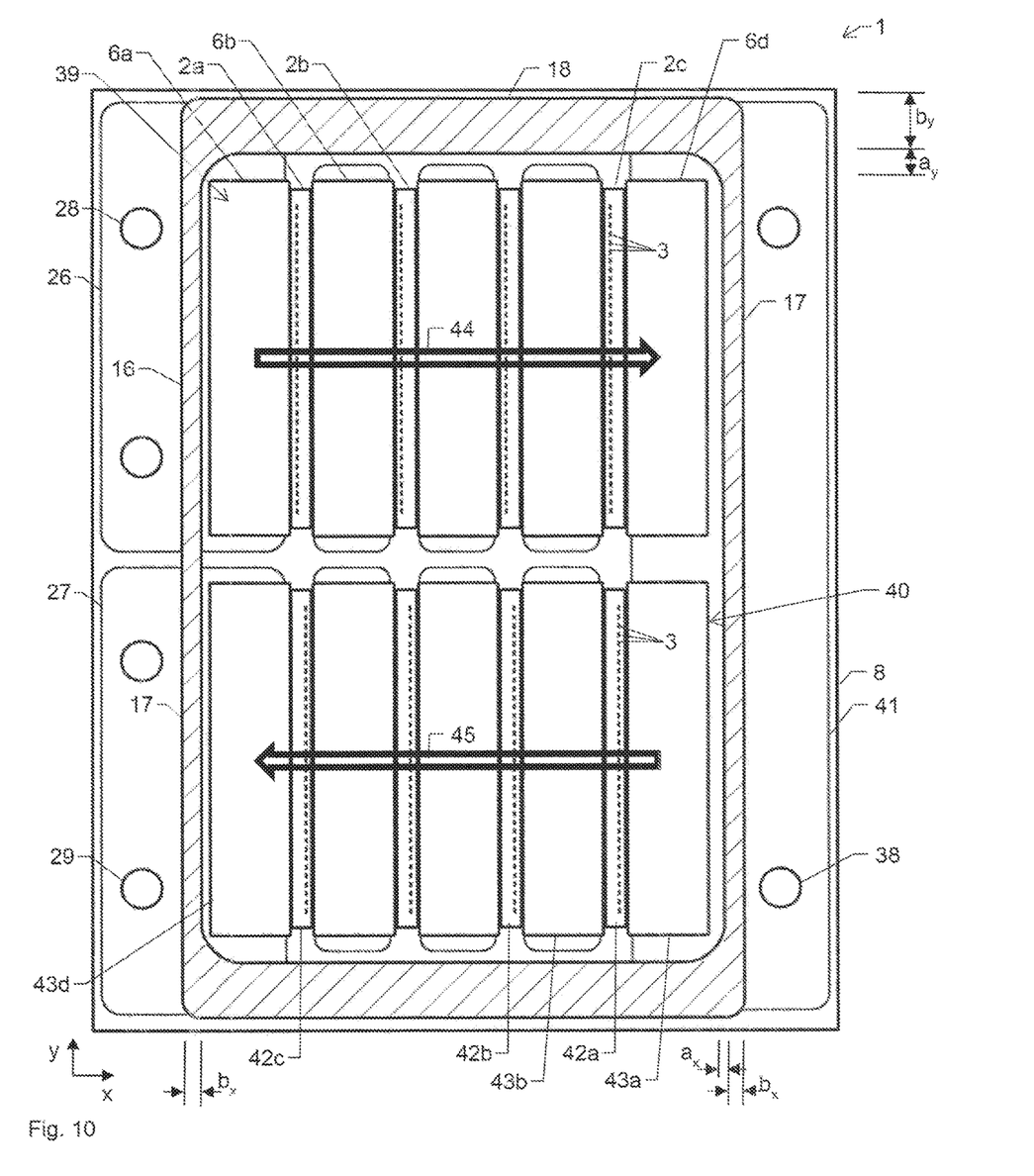
FIG. 10 shows an exemplary embodiment.

FIG. 10 shows a fifth exemplary embodiment. The diode laser 1 comprises a first laser arrangement 39 and at least one further laser arrangement 40. Each of the laser arrangements can also be referred to as a stack. The second laser arrangement is constructed in the same way as the first. The first laser arrangement comprises a plurality of laser bars 2 arranged offset with respect to one another in a direction x in parallel yz-planes, wherein each laser bar comprises a plurality of emitters arranged offset with respect to one another in a direction y and each having a light exit facet 3, which emit a laser radiation 5 in a main radiation direction z 4. The first laser arrangement additionally comprises a plurality of heat conducting bodies 6. Each of the further laser arrangements, in particular the second laser arrangement, can comprise a plurality of laser bars 42 arranged offset with respect to one another in a direction x in parallel yz-planes, wherein each laser bar comprises a plurality of emitters arranged offset with respect to one another in a direction y and each having a light exit facet 3, which emit a laser radiation 5 in the main radiation direction z 4. All the light exit facets of all laser arrangements present can be arranged in one plane. Each of the further laser arrangements, in particular the second laser arrangement, can comprise a plurality of heat conducting bodies 43. The diode laser comprises a multilayer substrate 8, comprising at least one first electrically insulating layer 9 and at least one first metallic layer 11, wherein the multilayer substrate has a mounting surface 15 in an xy-plane. The diode laser additionally comprises a frame 16 which is connected to the mounting surface by means of an electrically insulating first joining medium 20, and a window 21 transparent to the laser radiation, said window being arranged at a distance from the light exit facets of the emitters and being connected to the frame by means of a second joining medium 22. In this case, the second laser arrangement 40 is arranged alongside the first laser arrangement 39 in a manner offset in a direction y. The second laser arrangement 40 is arranged antiparallel to the first laser arrangement 39. That means that the second operating current direction 45, here in the −x-direction, is arranged antiparallel to the first operating current direction 44, here in the +x-direction. The diode laser has an interior 23 delimited by the frame, the window and the first electrically insulating layer of the multilayer substrate. The heat conducting bodies 6, 43 and the laser bars 2, 42 of all first and further laser arrangements are arranged in the interior. The interior has an interior volume $V_I$ and additionally a component volume $V_B$. The component volume can be that proportion of the interior volume which is occupied by material in the solid state of matter. The component volume is the sum of the volumes of the heat conducting bodies 6, 43, the laser bar 2, 42 and the layer regions of the first metallic layer that are situated in the interior. The component volume is more than 50% of the interior volume. The laser bars 2 of the first laser arrangement 39, following the order of the first current direction 44, can be numbered as first laser bar 2a, second laser bar 2b up to the last laser bar 2c. The laser bars 42 of the second laser arrangement 40, following the border of the second current direction 45, can be numbered as first laser bar 42a, second laser bar 42b up to the last laser bar 42c. In the same way, the heat conducting bodies 6 of the first laser arrangement 39, following the order of the first current direction 44, can be numbered as first heat conducting body 6a, second heat conducting body 6b up to the last heat conducting body 6d. The heat conducting bodies 43 of the second laser arrangement 40, following the order of the second current direction 45, can be numbered as first heat conducting body 43a, second heat conducting body 43b up to the last heat conducting body 43d.

Figure 11:
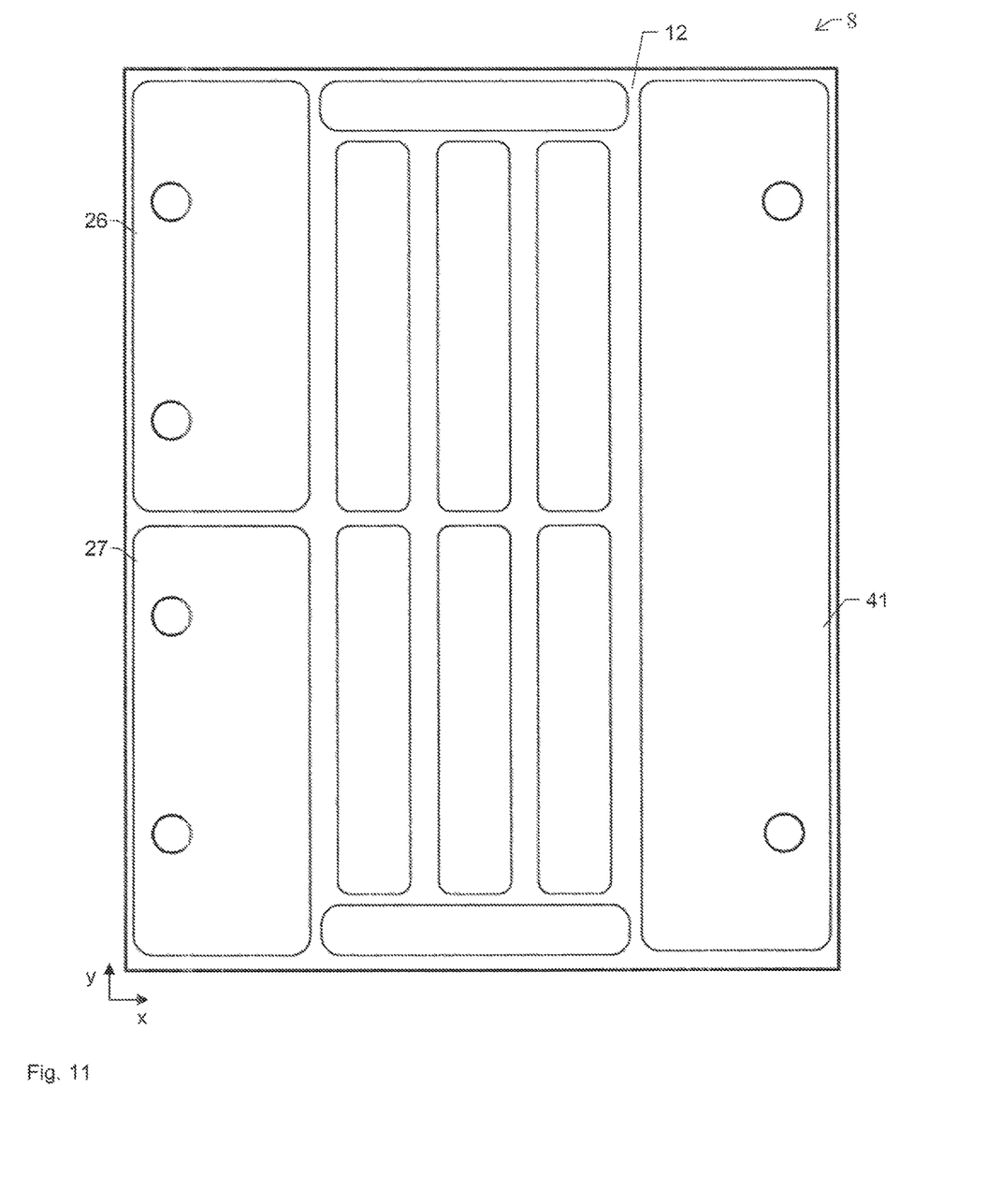
FIG. 11 shows the multilayer substrate of the exemplary embodiment.

FIG. 11 shows the multilayer substrate of the fifth exemplary embodiment. Owing to the antiparallel arrangement of the laser arrangements, the anode contact 26 and the cathode contact 27 are arranged on one side of the substrate. An electrical connection 41 of the first laser arrangement to the second is provided on the opposite side. The third cutout 38 here serves only for securing the diode laser, while the first and second cutouts 28 and 29, respectively can additionally be used for making electrical contact.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A diode laser comprising: at least two laser bars arranged offset with respect to one another in a direction x in parallel yz-planes, wherein each of the at least two laser bars comprise a plurality of emitters arranged offset with respect to one another in a direction y and each having a light exit facet, which emit a laser radiation in a main radiation direction z; at least two heat conducting bodies; a multilayer substrate comprising at least one first electrically insulating layer and at least one first metallic layer, the multilayer substrate having a mounting surface in an xy-plane; a frame connected to the mounting surface via an electrically insulating first joining medium; a window transparent to the laser radiation, which window is arranged at a distance from the light exit facets of the emitters and is connected to the frame via a second joining medium, wherein the diode laser has an interior delimited by the frame, the window and the first electrically insulating layer of the multilayer substrate, wherein the heat conducting bodies and the laser bars are arranged in the interior and the interior has an interior volume and has a component volume, and wherein the component volume is a proportion of the interior volume which is occupied by material in the solid state of matter, and the component volume is more than 50% of the interior volume; wherein the multilayer substrate has an inlet and an outlet for a coolant.

2. The diode laser as claimed in claim 1, wherein the light exit facets are arranged in an xy-plane and the window is arranged parallel to said xy-plane or the window is arranged in a manner inclined with respect to said xy-plane by an angle β about the y-axis.

3. The diode laser as claimed in claim 1, wherein a distance between the light exit facets of the emitters and the window is greater than 0.05 mm and/or less than 0.5 mm.

4. The diode laser as claimed in claim 1, wherein the interior is hermetically sealed.

5. The diode laser as claimed in claim 1, wherein the frame has in a z-projection first edges having a first edge width in the x-direction and second edges having a second edge width in the y direction and the first edge width is less than the second edge width.

6. The diode laser as claimed in claim 1, wherein the first edges are at a first distance $a_x$ from the heat conducting bodies and the second edges are at a second distance $a_y$ from the heat conducting bodies and the distance $a_x$ is less than the distance $a_y$.

7. The diode laser as claimed in claim 1, wherein the window has a thickness of at least 1 mm.

8. The diode laser as claimed in claim 1, wherein the first metallic layer has at least one anode contact and at least one cathode contact and an operating current fed from outside is conducted in a yx-plane into the interior.

9. The diode laser as claimed in claim 1, wherein, in the direction x alongside the frame at least one first cutout and in the direction −x alongside the frame at least one second cutout in the multilayer substrate are provided, wherein the first and second cutouts are provided for attaching the diode laser by screwing and/or for electrically contacting the diode laser.

10. The diode laser as claimed in claim 1, wherein the frame is produced from a plastic, a ceramic material or a glass.

11. The diode laser as claimed in claim 1, wherein the frame is produced from Ti, Al, Mg, Zn, another metal or Si or comprises one or more of these substances.

12. The diode laser as claimed in claim 1, wherein the frame has a superficial oxide or nitride layer.

13. A diode laser comprising: a first laser arrangement comprising: at least two laser bars arranged offset with respect to one another in a direction x in parallel yz-planes, wherein each laser bar comprises at least two emitters arranged offset with respect to one another in a direction y and each having a light exit facet, which emit a laser radiation in a main radiation direction z; and at least two heat conducting bodies; at least one further laser arrangement comprising: at least two laser bars arranged offset with respect to one another in a direction x in parallel yz-planes, wherein each laser bar comprises at least two emitters arranged offset with respect to one another in a direction y and each having a light exit facet, which emit a laser radiation in the main radiation direction z; and at least two heat conducting bodies; a multilayer substrate comprising at least one first electrically insulating layer and at least one first metallic layer, the multilayer substrate having a mounting surface in an xy-plane; a frame connected to the mounting surface via an electrically insulating first joining medium; and a window transparent to the laser radiation, which window is arranged at a distance from the light exit facets of the emitters and is connected to the frame via a second joining medium, wherein the at least one further laser arrangement is arranged alongside the first laser arrangement in a manner offset in a direction x and/or a direction y or the first laser arrangement and the further laser arrangements are arranged alongside one another in a manner offset in each case in a direction x and/or a direction y, wherein the diode laser has an interior delimited by the frame, the window and the first electrically insulating layer of the multilayer substrate, wherein the heat conducting body and the laser bars are arranged in the interior and the interior has an interior volume $V_I$ and the interior additionally has a component volume $V_B$, and wherein the component volume is that proportion of the interior volume which is occupied by material in the solid state of matter, and the component volume is more than 50% of the interior volume; wherein the multilayer substrate has an inlet and an outlet for a coolant.

14. The diode laser as claimed in claim 13, wherein the further laser arrangement is arranged antiparallel to the first laser arrangement.

15. A method for producing a diode laser, the method comprising: providing at least two laser bars, each of the at least two laser bars comprising at least two emitters having a light exit facet, which emit a laser radiation; providing at least two metallic heat conducting bodies; providing a multilayer substrate comprising at least one first electrically insulating layer and at least one first metallic layer, wherein the multilayer substrate has a mounting surface; providing a frame; providing a window transparent to the laser radiation; connecting the laser bars among one another and/or to the heat conducting bodies, the laser bars being arranged substantially parallel to one another and having a common main radiation direction; connecting the heat conducting bodies to the mounting surface via an electrical insulating first joining medium; connecting the frame to the mounting surface; and connecting the window to the frame, wherein the diode laser has an interior delimited by the frame, the window and the first electrically insulating layer of the multilayer substrate, wherein the heat conducting bodies and the laser bars are arranged in the interior and the interior has an interior volume $V_I$ and the interior additionally has an empty volume, and wherein the empty volume is that proportion of the interior volume which is occupied by material in the gaseous state of matter or by vacuum, and the empty volume being less than 50% of the interior volume; wherein the multilayer substrate has an inlet and an outlet for a coolant.

16. The diode laser as claimed in claim 1, wherein the diode laser and a light funnel disposed downstream of the diode laser in a beam path are arranged to uniformly illuminate a surface.

17. An arrangement for uniformly illuminating a surface, comprising a diode laser as claimed in claim 1 and a light funnel disposed downstream of the diode laser in the beam path.

* * * * *